(12) United States Patent
Lin et al.

(10) Patent No.: US 7,292,218 B2
(45) Date of Patent: Nov. 6, 2007

(54) SHIFT-REGISTER CIRCUIT (75) Inventors: Jan-Ruei Lin, Junghe (TW); Chang-Ho Liou, Shetou Township, Changhua County (TW); Chang-Cheng Lin, Taipei (TW); Yu-Lin Lee, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 617 days.

(21) Appl. No.: 10/865,311

(22) Filed: Jun. 10, 2004

(65) Prior Publication Data
US 2005/0104836 A1 May 19, 2005

(30) Foreign Application Priority Data
Nov. 18, 2003 (TW) .............. 92132219 A (51) Int. Cl.
*G09G 3/36* (2006.01)
*G11C 19/00* (2006.01)

(52) U.S. Cl. .............. 345/100; 345/99; 345/98; 377/75

(58) Field of Classification Search .......... 345/98–100; 377/64, 70, 75, 77, 78
See application file for complete search history.

(56) References Cited

U.S. PATENT DOCUMENTS

| 5,990,857 A | * | 11/1999 | Kubota et al. | ............ 345/98 |
| 7,164,414 B2 | * | 1/2007 | Tanaka | .......... 345/204 |
| 2002/0150199 A1 | * | 10/2002 | Sasaki et al. | .......... 377/64 |

* cited by examiner

*Primary Examiner*—Amr A. Awad
*Assistant Examiner*—Randal L Willis
(74) *Attorney, Agent, or Firm*—Thomas, Kayden, Horstemeyer & Risley (57) ABSTRACT

A shift-register circuit. The shift-register circuit has a plurality of shift-register units connected in series. Each of the shift-register units generates first and second pulse signals, wherein the first pulse signal is an output signal of the shift-register circuit and the second pulse signal is a trigger signal of a subsequent shift-register unit. A LCD panel driving circuit using the shift-register circuit is also disclosed.

22 Claims, 11 Drawing Sheets

SHIFT-REGISTER CIRCUIT

BACKGROUND OF THE INVENTION

1. Field of the Invention

The present invention relates to a shift-register circuit, and more particularly to a shift-register circuit applied in a liquid crystal display (LCD).

2. Description of the Related Art

Figure 1:
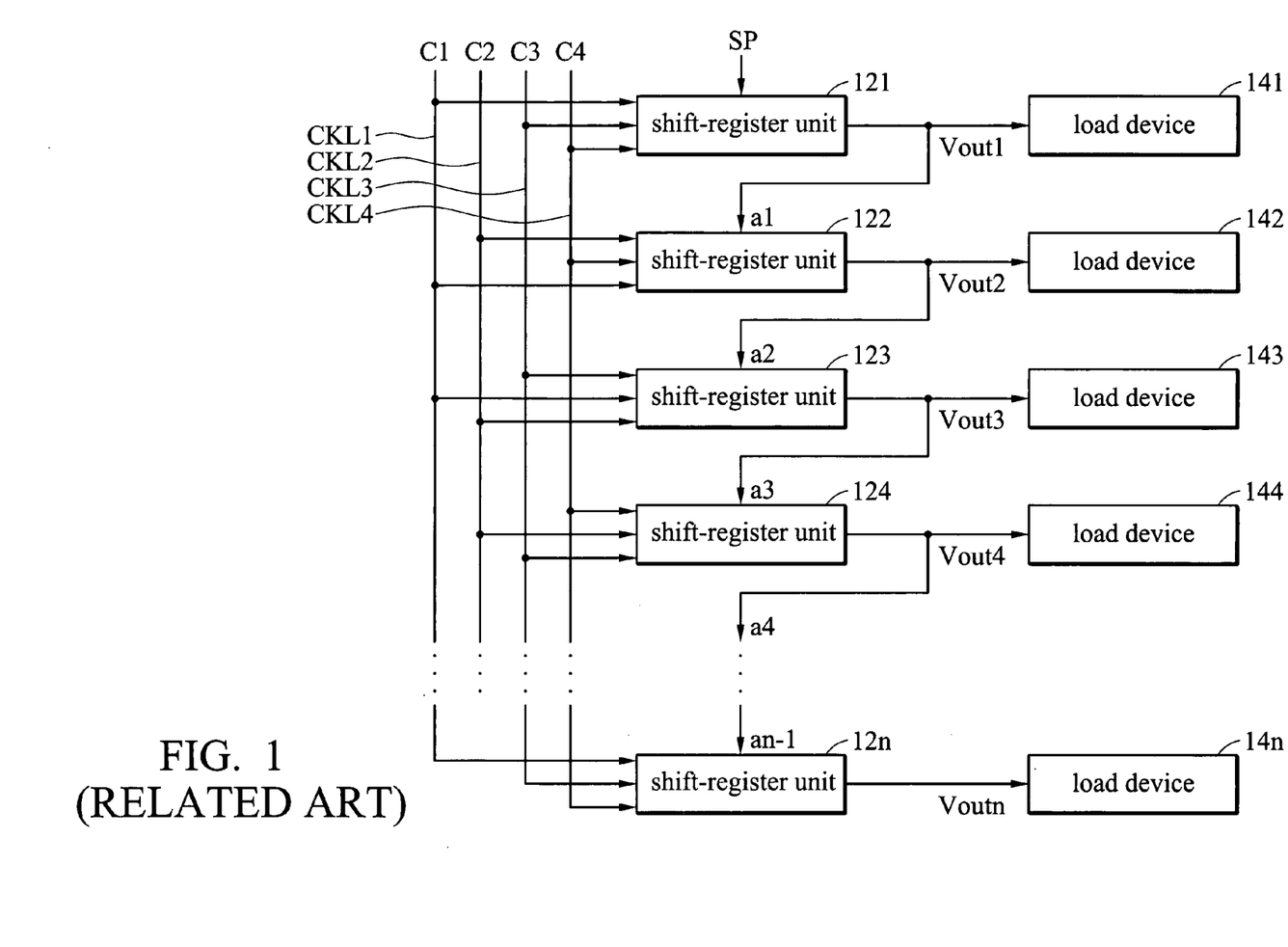
FIG. 1 is a circuit diagram of a convention shift-register circuit.

FIG. 1 is a circuit diagram of a convention shift-register circuit. The shift-register circuit generates output signals Vout1~Voutn for driving load device 141~14n. The shift-register circuit comprises shift-register units 121~12n. Each shift-register unit 121~12n generates an output signal for driving the corresponding load device and triggering the subsequent shift-register unit.

The voltage level of the output signal is altered when an error occurs in the load device. If an error occurs in the output signal, the voltage level of other output signals of the shift-register is also altered.

If the output signal Vout1 is at a high voltage level, the load device 141 and shift-register units 122 are driven by the output signal Vout1. When an error occurs in the load device 141, the voltage level of the output signal Vout1 drops from high voltage to low voltage level, and the shift-register units 122 are no longer driven by the output signal Vout1 such that the shift-register units 232~12n malfunction.

The conventional shift-register unit utilizes identical output signals to drive the load device and subsequent shift-register unit. The shift-register circuit will not generate the correct output signal when the load device changes the corresponding output signal of the shift-register unit.

SUMMARY OF THE INVENTION

It is therefore an object of the present invention to provide a shift-register circuit capable of preventing error in the output signal from affecting other normal output signals.

Another object of the present invention to provide a driving circuit applied in a LCD device.

According to the objects mentioned above, the present invention provides a shift-register circuit comprising a first-stage shift-register unit, a second-stage shift-register unit, a third-stage shift-register unit, and a fourth-stage shift-register unit. Each shift-register unit generates first and second pulse signals according to a trigger signal. Each first pulse signal is an output signal of the shift-register circuit and each second pulse signal is the trigger signal of the subsequent stage shift-register unit.

The present invention also provides a driving device controlling a liquid crystal display panel comprises a plurality of display units connected to data electrodes and gate electrodes. The driving device comprises a data driver and a gate driver. The data driver generates and outputs a video signal to the data electrodes. The gate driver generates and outputs a scan signal to the gate electrodes and comprises at least a first-stage shift-register unit, a second-stage shift-register unit, a third-stage shift-register unit, and a fourth-stage shift-register unit. Each shift-register unit generates first and second pulse signals according to a trigger signal. Each first pulse signal is an output signal of the shift-register circuit, and each second pulse signal is the trigger signal of the subsequent stage shift-register unit.

BRIEF DESCRIPTION OF THE DRAWINGS

The present invention can be more fully understood by reading the subsequent detailed description and examples with reference made to the accompanying drawings, wherein.

DETAILED DESCRIPTION OF THE INVENTION

Figure 2A:
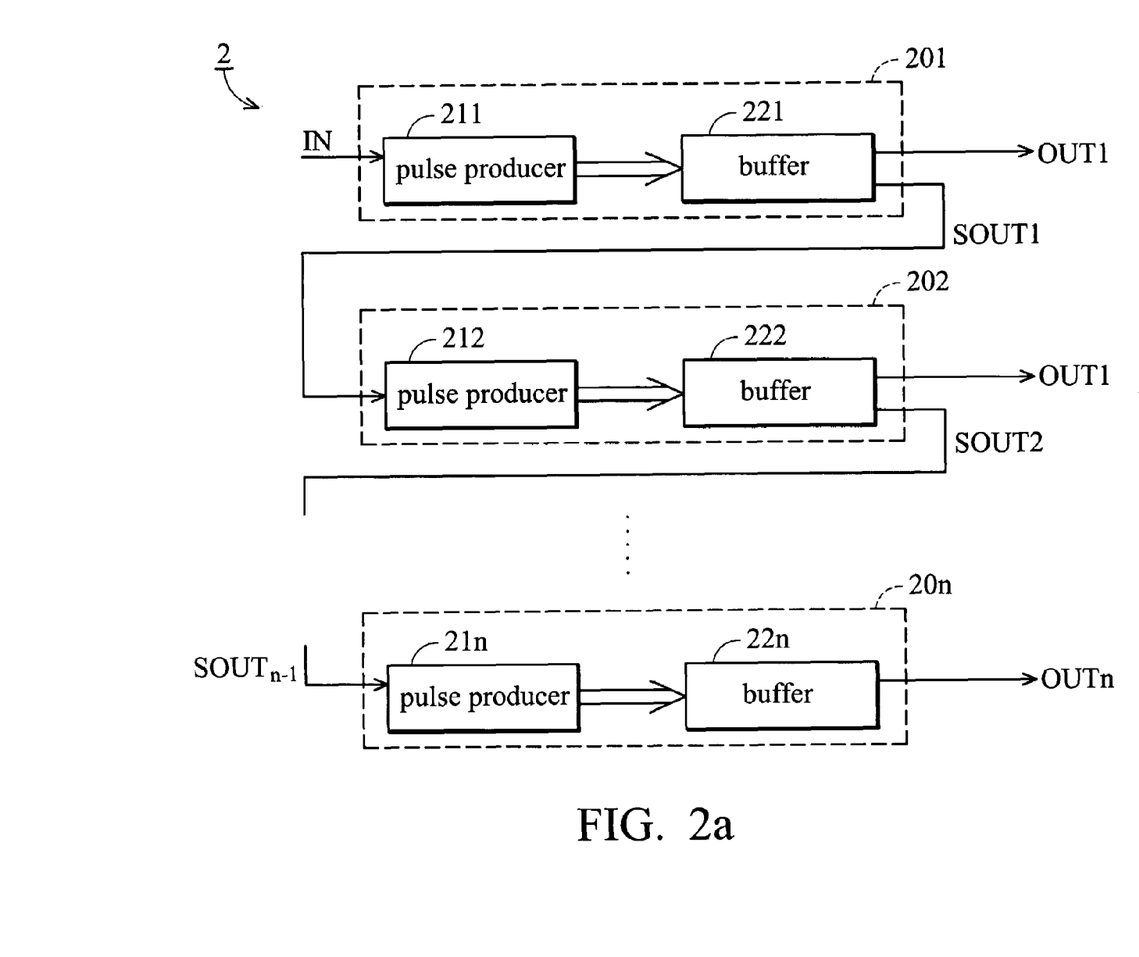
FIG. 2a is a circuit diagram of a shift-register circuit of the present invention.

FIG. 2a is a circuit diagram of a shift-register circuit of the present invention. The shift-register circuit 2 comprises shift-register units 201~20n, each outputting a first pulse signal and a second pulse signal according to a trigger signal. The first pulse signal OUTj generated from the shift-register unit 20j is an output signal of the shift-register circuit 2. The second pulse SOUTj generated from the shift-register unit 20j is the trigger signal of subsequent stage shift-register. The first and second pulse signals have the same waveform and level. The first pulse signal drives a load device, while the second pulse signal only triggers the subsequent stage shift-register unit. Therefore, a driving power of the first pulse signal is greater than a driving power of the second pulse signal.

For example, the shift-register unit 201 generates a first pulse signal OUT1 and a second pulse signal SOUT1 according the trigger signal IN. The first pulse signal OUT1 is an output signal of the shift-register circuit 2. The second pulse signal SOUT1 is the trigger signal of the subsequent stage shift-register unit 202.

Each shift-register unit 201~20n comprises a pulse producer (21j) and a buffer (22j). The pulse producer 21j receives the trigger signal for generating at least one output signal. The buffer 22j receives the output signal of the pulse producer for generating the first pulse signal OUTj and the second pulse signal SOUTj. For example, the shift-register unit 201 has a pulse producer 211 and a buffer 221.

Figure 2B:
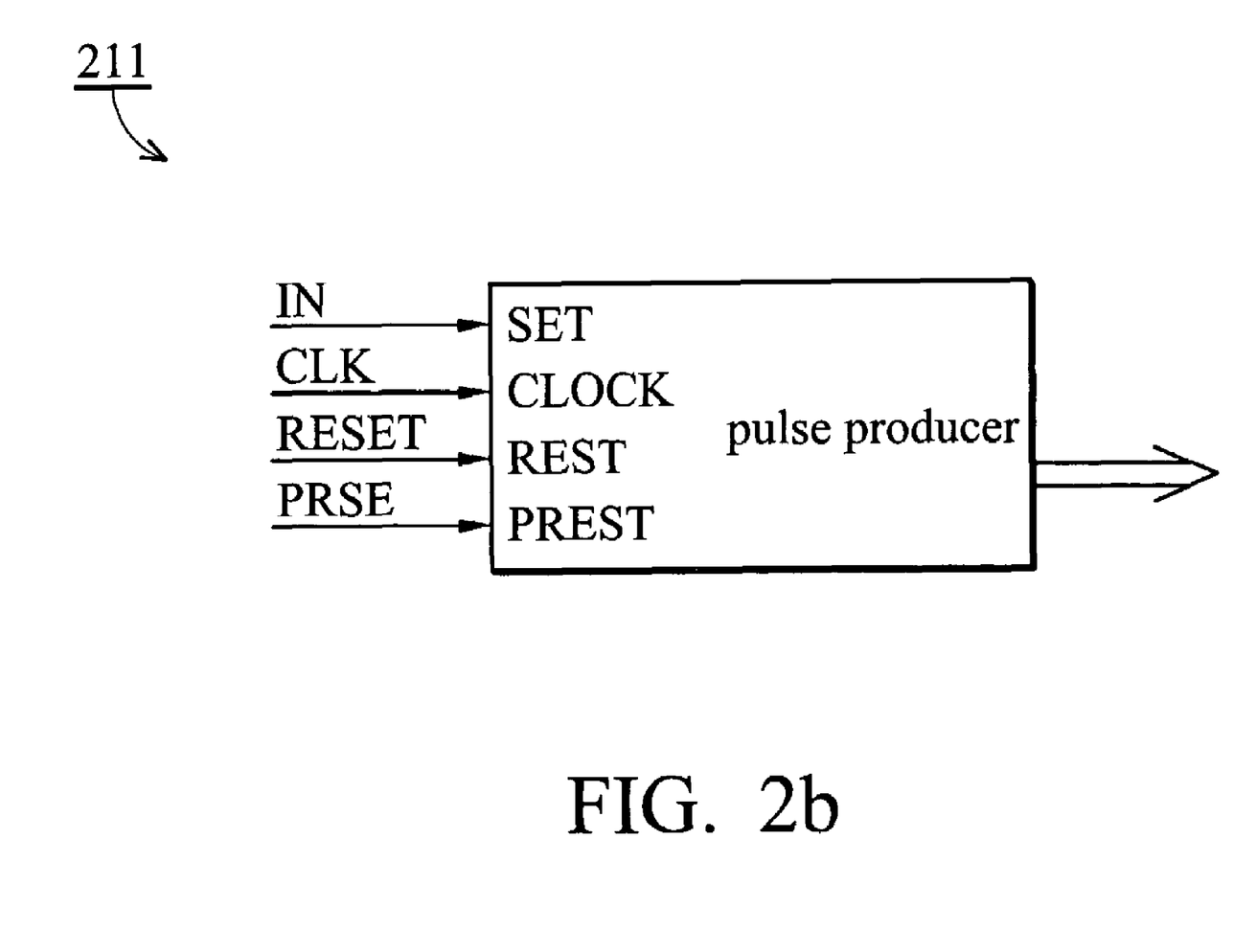
FIG. 2b is a diagram of the pulse producer.

FIG. 2b is a diagram of the pulse producer. Since the structures of the pulse producer 211~21n are the same, only the pulse producer 211 is described herein as an example. The pulse producer 211 comprises a clock terminal CLOCK, a setting terminal SET, a reset terminal REST, and a refresh terminal PRSET. The clock terminal CLOCK receives a clock signal CLK. The setting terminal SET receives the trigger signal IN for driving the pulse producer 211 to generate the output signals to the buffer 221. The reset terminal REST receives a reset signal RESET to reset the pulse producer 211 to stop generating the output signal to the buffer 221. The refresh terminal PRSET receives a refresh signal PRSE for setting the initial output signals.

Figure 3A:
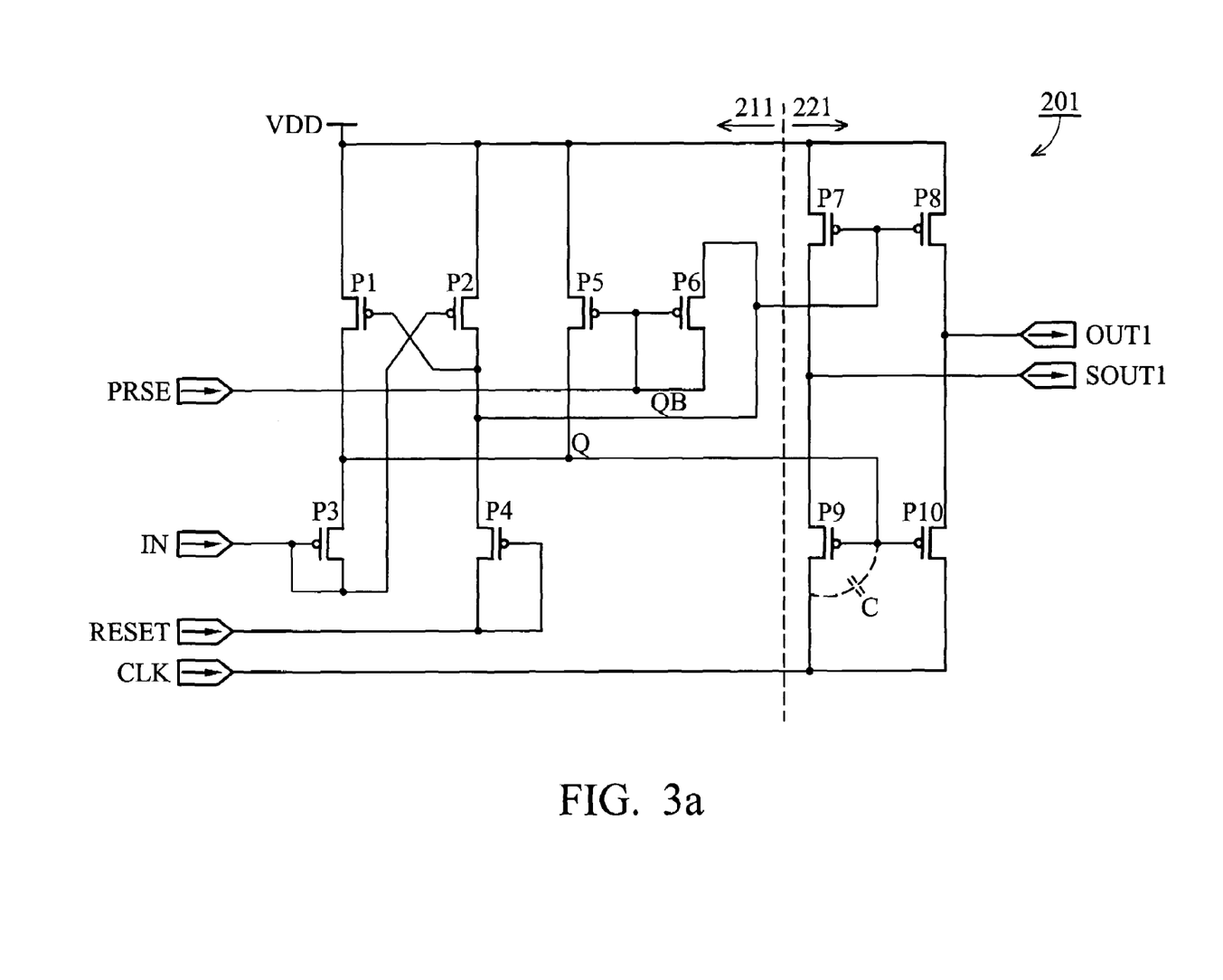
FIG. 3a shows the shift-register unit according to the first embodiment of the present invention.

FIG. 3a shows the shift-register unit according to the first embodiment of the present invention. Since the structures of the shift-register units 201~20n are the same, only the shift-register unit 201 is described herein as an example. The shift-register unit 201 comprises the pulse producer 211 and the buffer 221. Each pulse producer 211 comprises thin film transistors (TFTs) or MOS transistors of the same type. Each buffer 221 comprises of thin film transistors (TFTs) or MOS transistors of the same type.

The pulse producer 211 comprises transistors P1~P6. The transistor P1 has a first source/drain coupled to a first voltage level VDD. The transistor P2 has a first source/drain coupled to the first voltage level VDD, a second source/drain coupled to a gate of the transistor P1, and a gate receiving the trigger signal IN. The transistor P3 has a first source/drain coupled to a second source/drain of the transistor P1 and a second source/drain coupled to the gate of the transistor P2. The transistor P4 has a first source/drain coupled to the gate of the transistor P1 and a second source/drain coupled to the reset signal RESET. The transistor P5 has a first source/drain coupled to the voltage level VDD, a second source/drain coupled to the second source/drain of the transistor P1 for generating the first output signal Q, and a gate receiving the refresh signal PRSE. The transistor P6 has a first source/drain coupled to the second source/drain of the transistor P2 for generating the second output signal QB and a second source/drain and a gate, both coupled to the refresh signal PRSE.

The buffer 221 comprises transistors P7~P10. The transistor P7 has a first source/drain coupled to the first voltage level VDD, a second source/drain outputting the second pulse signal SOUT1, and a gate receiving the second output signal QB. The transistor P8 has a first source/drain coupled to the first voltage level VDD, a second source/drain outputting the first pulse signal OUT1, and a gate coupled to the gate of the transistor P7. The transistor P9 has a first source/drain coupled to the second source/drain of the transistor P7, a second source/drain coupled to the clock signal CLK, and a gate coupled the first output signal Q. The transistor P10 has a first source/drain coupled to the second source/drain of the transistor P8, a source/drain coupled to the clock signal CLK, and a gate coupled to the gate of the transistor P9.

In the first embodiment of the present invention, the pulse producer 211 generates the first output signal Q and the second output signal QB to the buffer 221. The pulse producer 211 uses an inverter only when generating an output signal. The inverter generates an opposite output signal to the buffer 221 such that the buffer 221 generates two pulse signals.

Figure 3B:
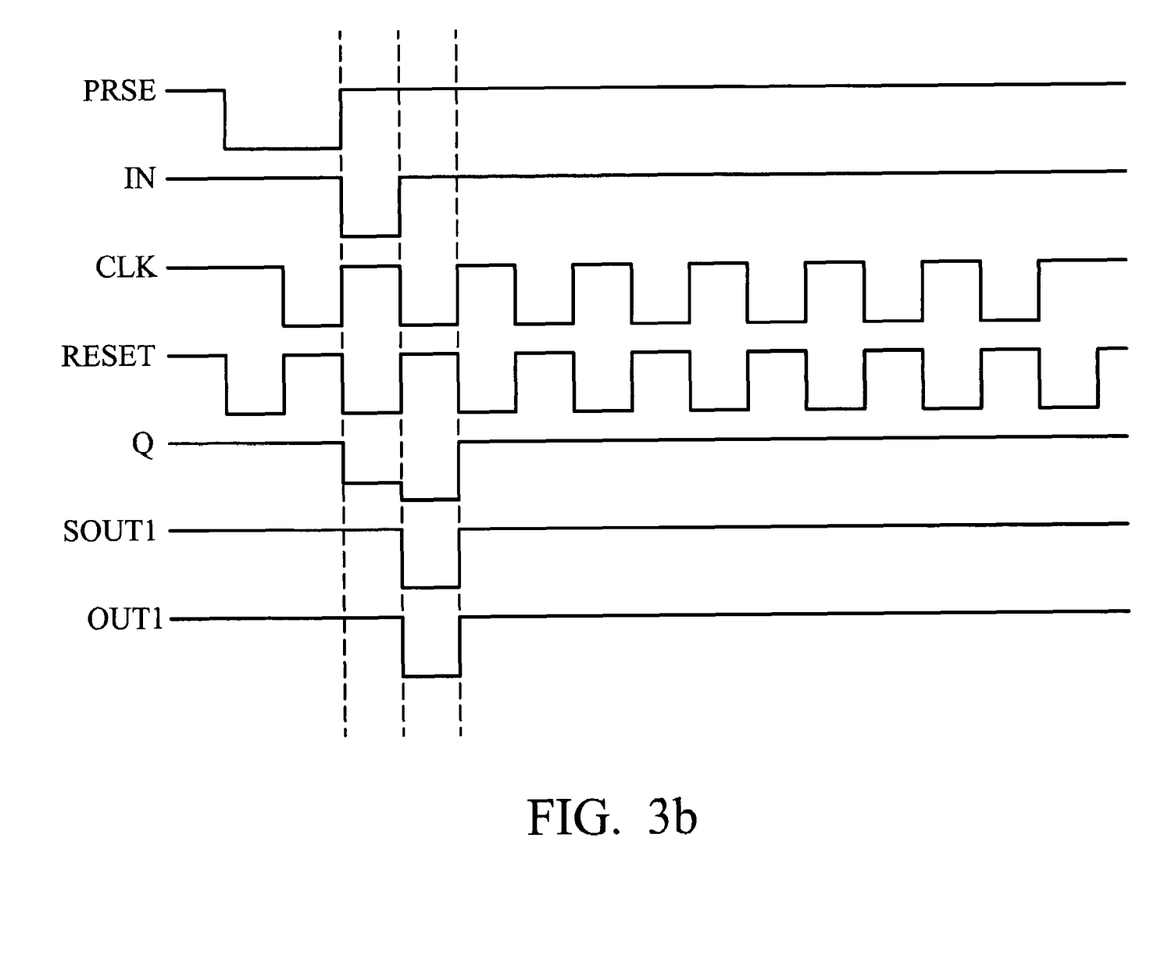
FIG. 3b shows a timing chart of the shift-register unit according to the first embodiment of the present invention.

FIG. 3b shows a timing chart of the shift-register unit according to the first embodiment of the present invention. The transistors P5 and P6 turn on as the refresh signal PRSE drops to a low voltage level. The first pulse signal OUT1 and the second pulse signal SOUT1 are at a high voltage level when transistors P7 and P8 are turned on. The trigger signal IN drops to a low voltage level such that the transistor P3 is turned on. Therefore, the first output signal Q drops. When the clock signal CLK drops to a low voltage level and the trigger signal IN rises to a high voltage level, the transistor P3 turns off and the first output signal Q is in a floating state. A parasitical capacitor is located between the gate and the second source/drain of the transistors P9 and P10 such that the first output signal Q drops to a lower voltage level. The transistors P9 and P10 are turned on so that the first pulse signal OUT1 and the second pulse signal SOUT1 drop to low voltage level. The transistor P4 turns on as the reset signal RESET drops to a low voltage level. Transistors P7 and P8 are turned on such that the voltage level of the first pulse signal OUT1 and the second pulse signal SOUT1 changes from a low voltage level to a high voltage level. Since the driving power of the first pulse signal is greater than that of the second pulse signal, the channel size of the transistors P8 and P10 are greater than that of transistors P7 and P9.

Figure 4A:
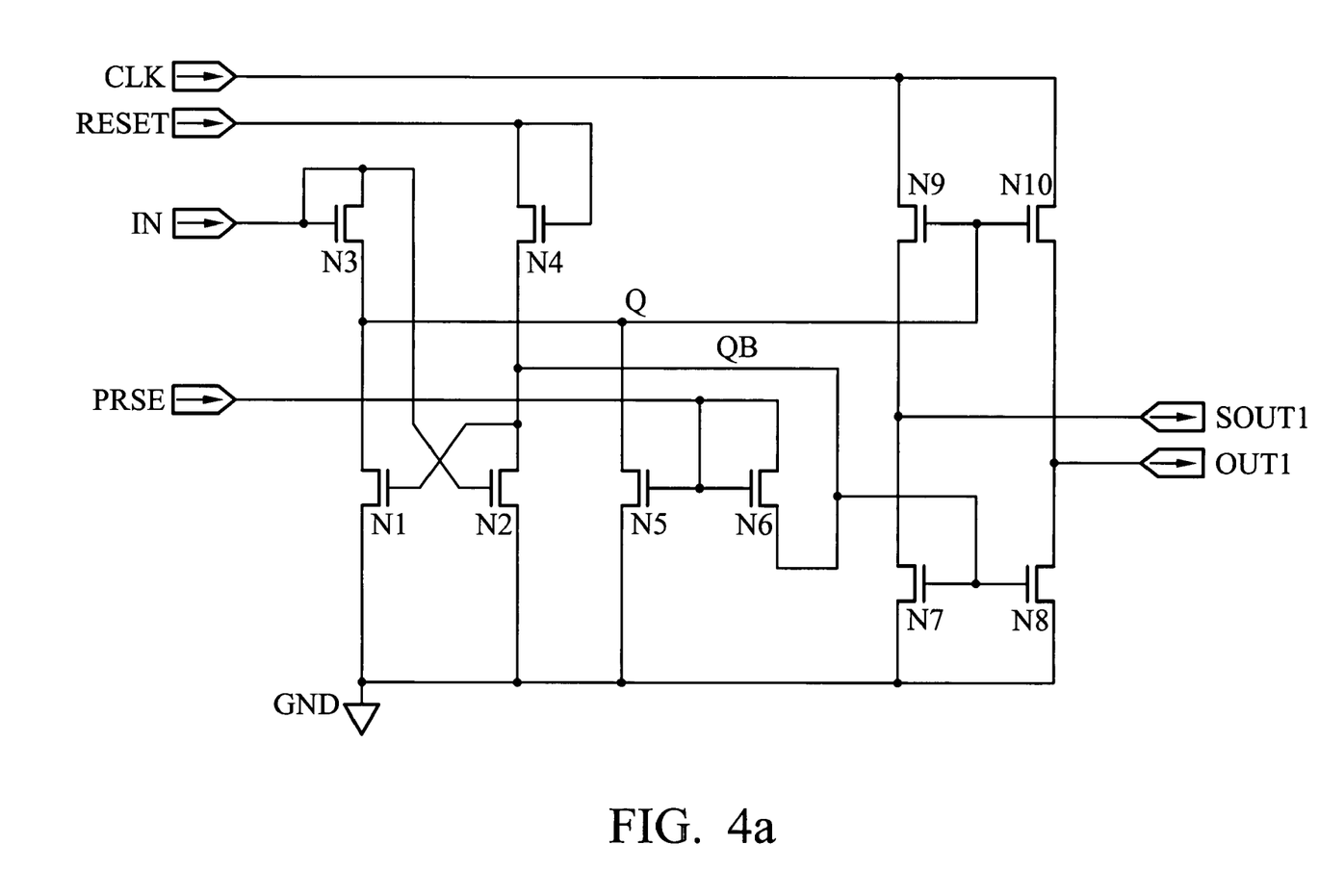
FIG. 4a shows the shift-register unit according to the second embodiment of the present invention.
Figure 4B:
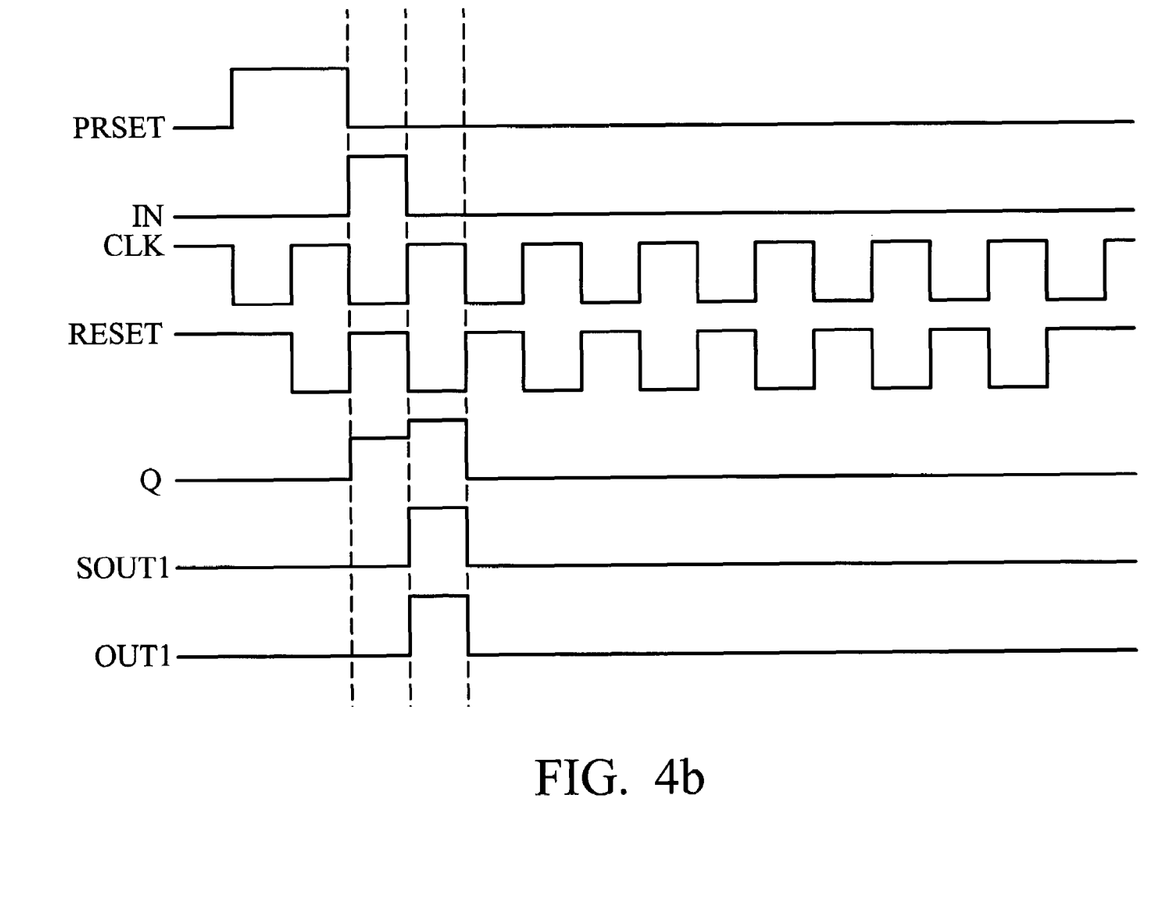
FIG. 4b shows a timing chart of the shift-register unit according to the second embodiment of the present invention.

FIG. 4a shows the shift-register unit according to the second embodiment of the present invention. The shift-register unit is composed of N-type transistors N1~N10. FIG. 4b shows a timing chart of the shift-register unit according to the second embodiment of the present invention. In FIG. 4B, the timing and the voltage levels of the signals are inverted to the signals shown in FIG. 3b.

Figure 5A:
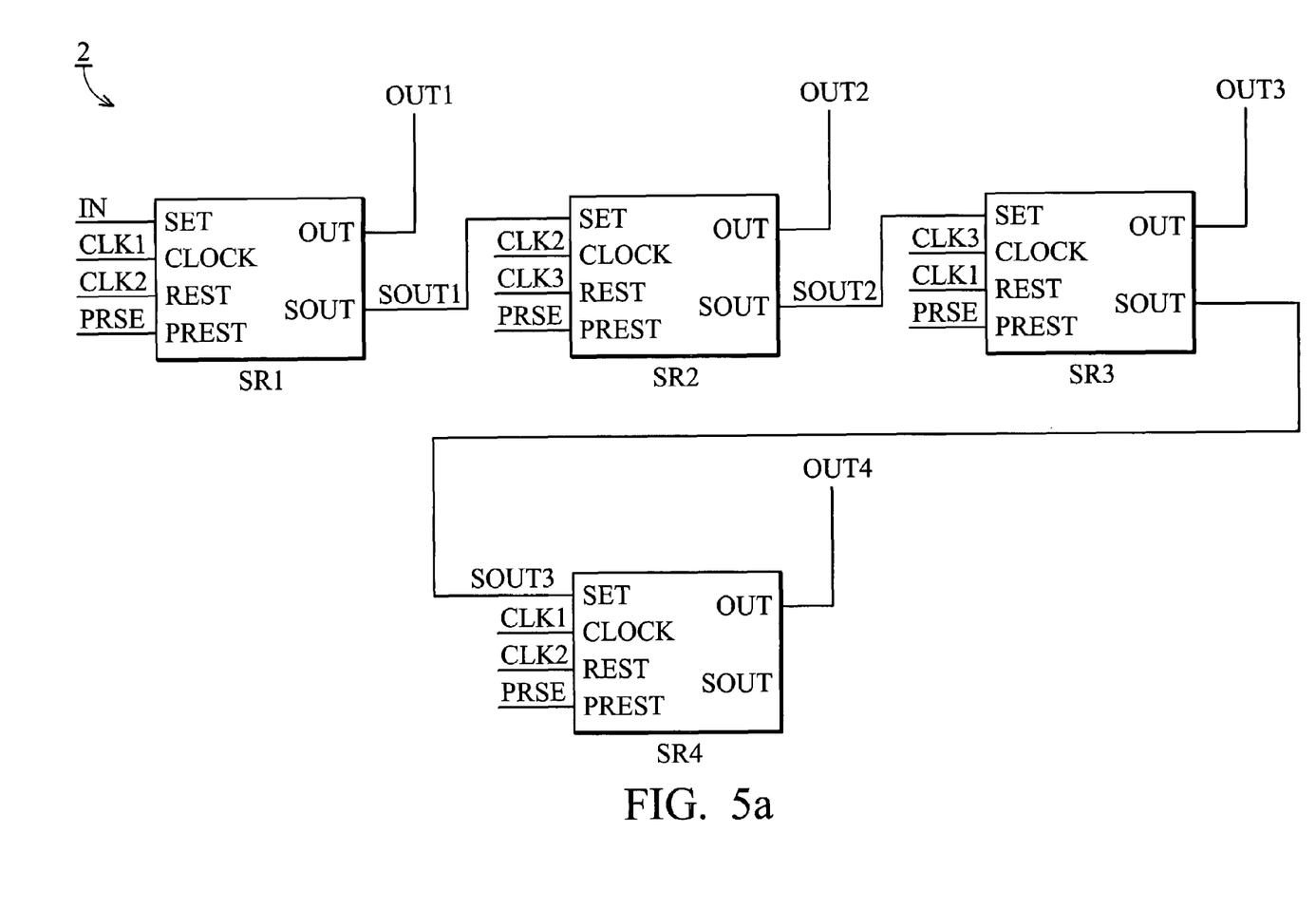
FIG. 5a is a block diagram of the shift-register circuit of the present invention.

FIG. 5a is a block diagram of the shift-register circuit of the present invention. FIG. 5 shows four stage shift-register units. The labels SR1~SR4 represent shift-register units from the first stage to the fourth stage. The shift-register units SR1~SR4 are connected in series. Each shift-register unit SR1~SR4 comprieses a setting terminal SET, a clock terminal CLOCK, a reset terminal REST, a refresh terminal PRSET, a first output terminal OUT, and a second output terminal SOUT.

The refresh terminals PRSET of the shift-register units SR1~SR4 receive a refresh signal PRSE. The setting terminal SET of the shift-register unit SR1 receives the trigger signal IN. The setting terminal SET of the shift-register unit SR2 is coupled to the second output terminal SOUT of the shift-register unit SR1. The setting terminal SET of the shift-register unit SR3 is coupled to the second output terminal SOUT of the shift-register unit SR2. The setting terminal SET of the shift-register unit SR4 is coupled to the second output terminal SOUT of the shift-register unit SR3. The shift-register units SR1~SR4 output the first pulse signals from the first output terminal OUT as the output signals of the shift-register circuit 2.

The present invention utilizes three clock signals CLK1~CLK3 as the clock signal CLK and reset signal RESET. FIG. 5a shows the waveform of the clock signals CLK1~CLK3.

In n stage shift-register units, the clock terminal CLOCK of the (3a-2)th stage (0<3a-2<n+1) are coupled to the first clock signal CLK1 as the clock signal, and the reset terminal REST of the (3a-2)th stage (0<3a-2<n+1) are coupled to the second clock signal CLK2 as the reset signal. The clock terminal CLOCK of the (3a-1)th stage (0<3a-2<n+1) are coupled to the second clock signal CLK21 as the clock signal, and the reset terminal REST of the (3a-1)th stage (0<3a-2<n+1) are coupled to the third clock signal CLK3 as the reset signal. The clock terminal CLOCK of the (3a)th stage (0<3a-2<n+1) are coupled to the third clock signal CLK3 as the clock signal, and the reset terminal REST of the (3a)th stage (0<3a-2<n+1) are coupled to the first clock signal CLK1 as the reset signal.

The clock terminals CLOCK of the shift-register units SR1 and SR4 are coupled to the first clock signal CLK1, and the reset terminals RES of the shift-register units SR1 and SR4 are coupled to the second clock signal CLK2. The clock terminal CLOCK of the shift-register unit SR2 is coupled to the second clock signal CLK2, and the reset terminal REST of the shift-register unit SR2 is coupled to the third clock signal CLK3. The clock terminal CLOCK of the shift-register unit SR3 is coupled to the third clock signal CLK3, and the reset terminal REST of the shift-register unit SR3 is coupled to the first clock signal CLK1.

Figure 5B:
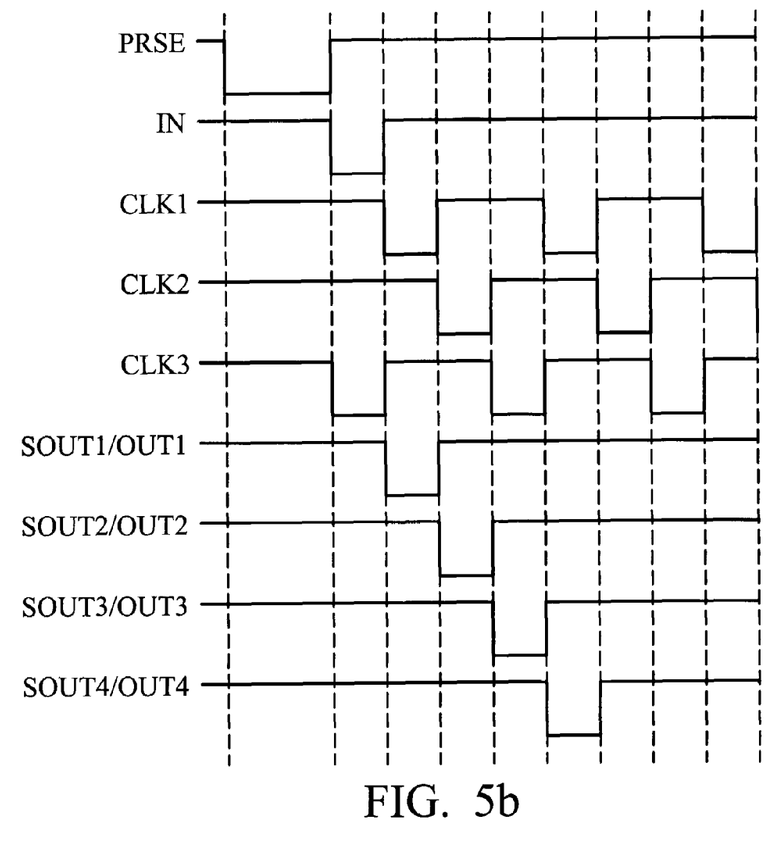
FIG. 5b shows a timing chart of the four stage shift-register circuit according to the first embodiment of the present invention.
Figure 5C:
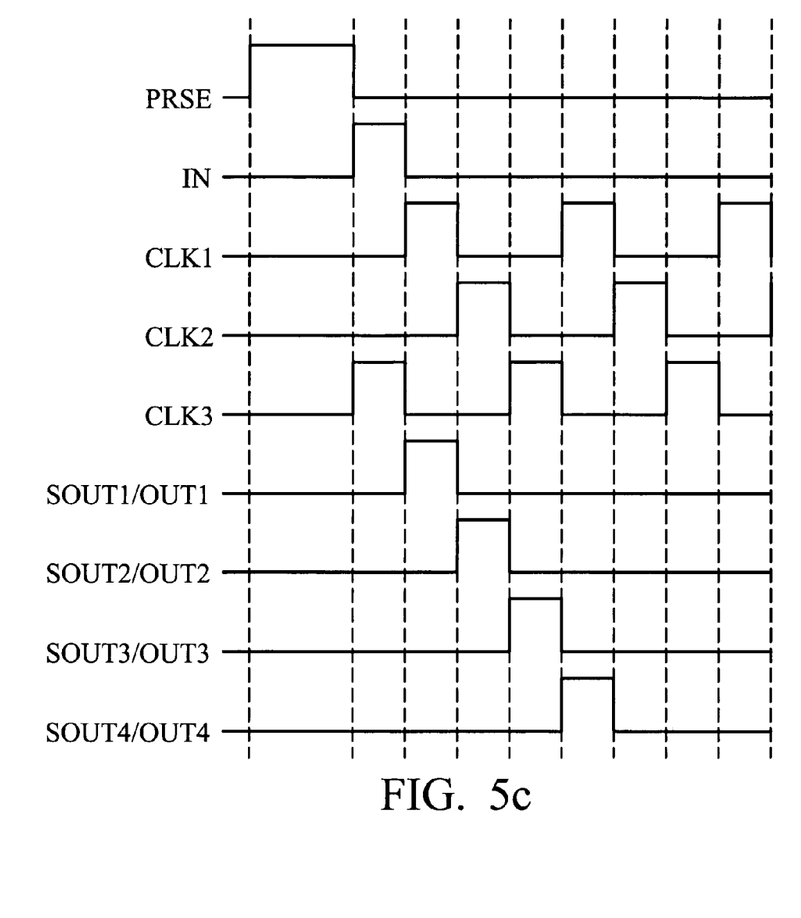
FIG. 5c shows a timing chart of the four stage shift-register circuit according to the second embodiment of the present invention.

FIG. 5b shows a timing chart of the four stage shift-register circuit according to the first embodiment of the present invention. FIG. 5c shows a timing chart of the four stage shift-register circuit according to the second embodiment of the present invention. The four stage shift-register circuit of the first embodiment comprises only P-type transistors while the four state shift register circuit of the second embodiment comprises only N-type transistors. In FIG. 5b, the timing and the voltage level of the signals are inverted to the signal shown in FIG. 5c.

Since the operation of the shift-register units SR1~SR4 are the same, only shift-register units SR1 and SR2 are described herein as an example. The refresh terminals of the shift-register units SR1~SR4 receive the refresh signal PRSE, such that the shift-register units SR1~SR4 are at a high voltage level. The first and second output terminals of the shift-register unit SR1 output the first clock signal CLK1 as the shift-register unit SR1 receives the trigger signal IN. The output signal OUT1 is generated from the shift-register unit SR1 as an output signal of the shift-register circuit 2. The output signal SOUT1 is generated from the shift-register unit SR1 as the trigger signal of the shift-register unit SR2. The first output signal OUT1 and second output signal SOUT1 are raised from a low voltage level to a high voltage level as the clock signal CLK2 drops to a low voltage level.

The first output terminal OUT and second output terminal SOUT of the shift-register unit SR2 generate the second clock signal CLK2 when the setting terminal of the shift-register unit SR2 receives the output signal SOUT1 generated from the shift-register unit SR1. The output signal OUT2 is generated from the shift-register unit SR2 as the output signal of the shift-register circuit 2. The output signal SOUT1 is generated from the shift-register unit SR2 as the trigger signal of the shift-register unit SR3. The first output signal OUT2 and the second output signal SOUT2 raises from a low voltage level to a high voltage level as the clock signal CLK3 drops to a low voltage level.

According to the this embodiment of the present invention, each shift-register unit of the shift-register circuit generates a pulse after the previous stage shift-register unit has generated a pulse drving a predetermined period.

Figure 6:
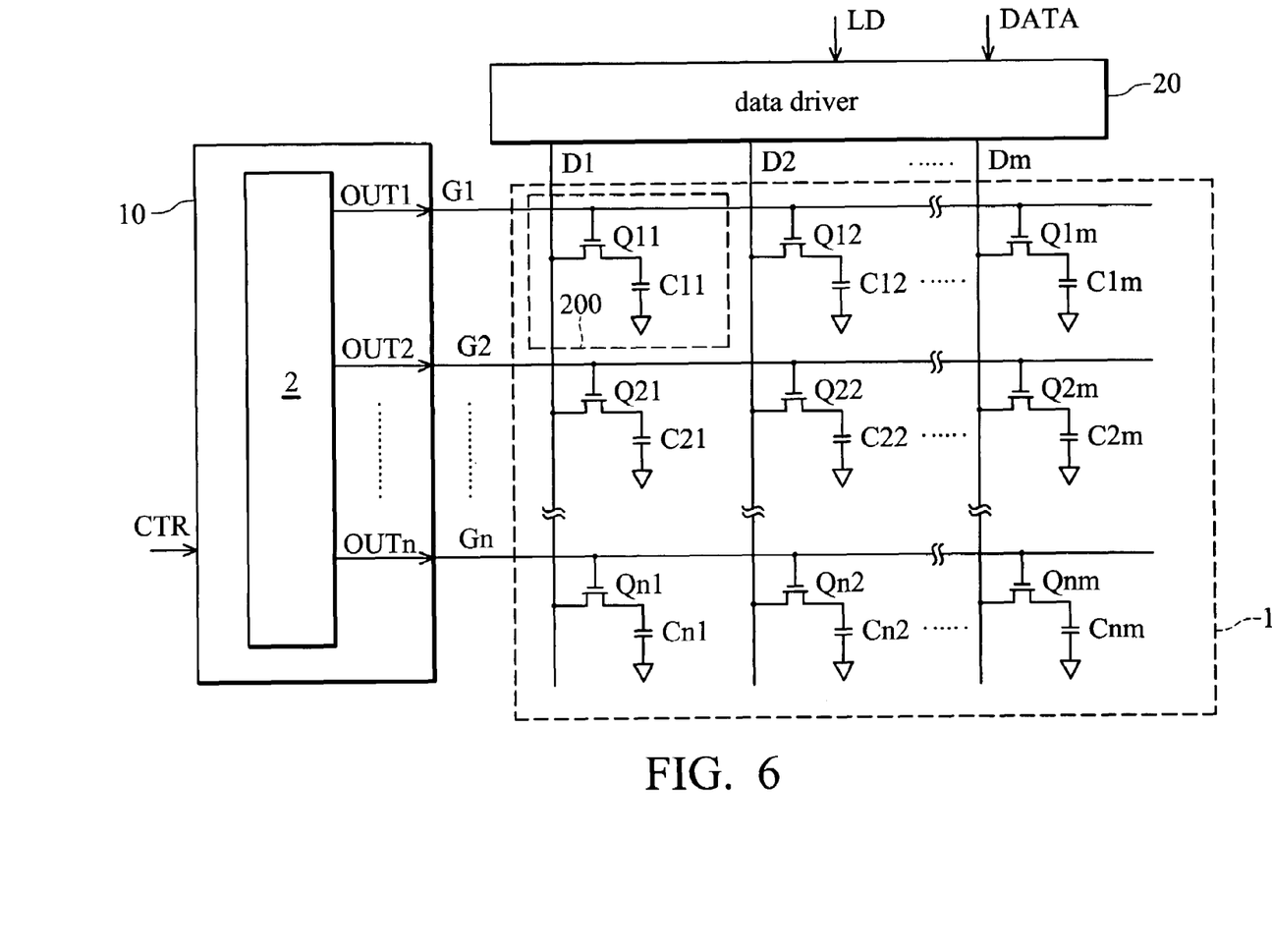
FIG. 6 is a schematic diagram of a LCD panel and the peripheral driving circuit applied therein.

The shift-register circuit is applied in a driving circuit of a liquid crystal display (LCD) panel. FIG. 6 is a schematic diagram of a LCD panel and the peripheral driving circuit thereof. As shown in the figure, a LCD panel 1 is formed by interlacing data electrodes (represented by D1, D2, D3, . . . , Dm) and gate electrodes (represented by G1, G2, G3, . . . , Gn), each of the interlaced data electrodes and gate electrodes is used to control a display unit. For example, the interlaced data electrode D1 and gate electrode G1 controls the display unit 200.

The equivalent circuit of each display unit comprises thin film transistors (TFT) (Q11-Q1m, Q21-Q2m, . . . , Qn1-Qnm) and storage capacitors (C11-C1m, C21-C2m, . . . , Cn1-Cnm). The gate and drain of TFTs are connected to the gate electrodes (G1-Gn) and the data electrodes (D1-Dm) respectively. The connection can turn all the TFTs on the same line (i.e. positioned on the same scan line) on or off using a scan signal of the gate electrodes (G1-Gn), thereby controlling the video signal of the data electrodes to be written into the corresponding display unit.

Gate driver 10 generates the scan signals (also referred to as scan pulses) of each gate electrode G1, G2, . . . , Gn according to a predetermined sequence. When a scan signal is carried by a gate electrode, the TFTs within all display units on the same row or the same scan line are turned on while the TFTs within all display units on other rows or other scan lines are turned off. When a scan line is selected, the data driver 20 generates a video signal (gray value) to m display units of the respective row through data electrodes D1, D2, . . . , Dm according to the image data to be displayed.

Gate driver 10 comprises a shift-register circuit 2 for generating and outputting the scan signals to the gate electrodes G1, G2, . . . , Gn. Each of the shift-register units generates a first pulse signal and a second pulse signal. The first pulse signal is the scan signal. The second pulse signal is the trigger signal of subsequent stage shift-register unit. When an error occurs in a display unit, the voltage level of the corresponding scan signal changes. Since the scan signal and the trigger signal are not generated from the same output terminal, the trigger signal is not altered by the display unit. Therefore, the other shift-register units generate normal scan signals and trigger signals.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shift-register circuit comprising:
n stage shift-register units, each outputting a first and a second pulse signal according to a trigger signal, wherein the first pulse signal is an output signal of the shift-register circuit and the second pulse signal is trigger signal of the subsequent stage shift-register unit, and wherein each of the shift-register units comprises:
a pulse producer receiving the trigger signal for generating at least one output signal; and
a buffer receiving the output signal of the pulse producer for generating the first and the second pulse signals, wherein the first and second pulse signals have the same waveform and voltage level, and wherein a driving power of the first pulse signal is greater than a driving power of the second pulse signal.

2. The shift-register circuit as claimed in claim 1, wherein the pulse producer comprises:
a clock terminal receiving a clock signal;
a setting terminal receiving the trigger signal for driving the corresponding pulse producer to generate the output signals to the buffer; and
a reset terminal for receiving a reset signal to reset the corresponding pulse producer to stop generating the output signal.

3. The shift-register circuit as claimed in claim 2, wherein the clock terminal of the (3a-2)th stage shift-register unit is coupled to a first clock signal as the clock signal, the reset terminal of the (3a-2)th stage shift-register unit is coupled to a second clock signal as the reset signal, the clock terminal of the (3a-1)th stage shift-register unit is coupled to the second clock signal as the clock signal, the reset terminal of the (3a-1)th stage shift-register unit is coupled to a third clock signal as the reset signal, the clock terminal of the (3a)th stage shift-register unit is coupled to the third clock signal as the clock signal, and the reset terminal of the (3a)th stage shift-register unit is coupled to the first clock signal as the reset signal.

4. The shift-register circuit as claimed in claim 3, wherein the pulse producer further comprises a refresh terminal receiving a refresh signal for setting a start stage of the output signals.

5. The shift-register circuit as claimed in claim 4, wherein the buffer further comprises an inverter when the pulse producer only generates an output signal.

6. The shift-register circuit as claimed in claim 4, wherein the pulse producer generates a first and second output signal.

7. The shift-register circuit as claimed in claim 6, wherein each of the pulse producers comprises:
 a first transistor having a first source/drain coupled to a first voltage level;
 a second transistor having a first source/drain coupled to the first voltage level, a second source/drain coupled to a gate of the first transistor, and a gate receiving the setting signal;
 a third transistor having a first source/drain coupled to a second source/drain of the first transistor and a second source/drain coupled to the gate of the second transistor;
 a fourth transistor having a first source/drain coupled to the gate of the first transistor and a second source/drain coupled to the trigger signal;
 a fifth transistor having a first source/drain coupled to the first voltage level, a second source/drain coupled to the second source/drain of the first transistor for generating the first output signal, and a gate receiving the refresh signal; and
 a sixth transistor having a first source/drain coupled to the second source/drain of the second transistor and a second source/drain and a gate, both coupled to the refresh signal.

8. The shift-register circuit as claimed in claim 7, wherein each of the buffers comprises:
 a seventh transistor having a first source/drain coupled to the first voltage level, a second source/drain outputting the second pulse signal, and a gate receiving the second output signal;
 an eighth transistor having a first source/drain coupled to the first voltage level, a second source/drain outputting the first pulse signal, and a gate coupled to the gate of the seventh transistor;
 a ninth transistor having a first source/drain coupled to the second source/drain of the seventh transistor, a second source/drain coupled to the clock signal, and a gate coupled the first output signal; and
 a tenth transistor having a first source/drain coupled to the second source/drain of the eighth transistor, a source/drain coupled to the clock signal, and a gate coupled to the gate of the ninth transistor.

9. The shift-register circuit as claimed in claim 8, wherein the transistors are P-type and the first voltage level is high voltage level.

10. The shift-register circuit as claimed in claim 8, wherein the transistors are N-type and the first voltage level is a ground level.

11. The shift-register circuit as claimed in claim 8, wherein the channel size of the eighth and tenth transistors is greater than the channel size of the seventh and ninth transistors.

12. A driving device controlling a liquid crystal panel comprising a plurality of display units connected to data electrodes and gate electrodes, comprising:
 a data driver for outputting a video signal to the data electrodes; and
 a gate driver for outputting a scan signal to the gate electrodes and comprising at least:
  n stage shift-register units, each outputting a first and a second pulse signal according to a trigger signal, wherein the first pulse signal is an output signal of the shift-register circuit and the second pulse signal is a trigger signal of the subsequent stage shift-register unit, and wherein each shift-register unit comprises:
   a pulse producer receiving the trigger signal for generating at least one output signal; and
   a buffer receiving the output signal of the pulse producer for generating the first and the second pulse signals, wherein the first and second pulse signals have the same waveform and voltage level and wherein a driving power of the first pulse signal is greater than a driving power of the second pulse signal.

13. The driving device as claimed in claim 12, wherein the pulse producer comprises:
 a clock terminal receiving a clock signal;
 a setting terminal receiving the trigger signal for driving the corresponding pulse producer to generate the output signals to the buffer; and
 a reset terminal for receiving a reset signal to reset the corresponding pulse producer to stop generating the output signal.

14. The driving device as claimed in claim 13, wherein the clock terminal of the (3a-2)th stage shift-register unit is coupled to a first clock signal as the clock signal, the reset terminal of the (3a-2)th stage shift-register unit is coupled to a second clock signal as the reset signal, the clock terminal of the (3a-1)th stage shift-register unit is coupled to the second clock signal as the clock signal, the reset terminal of the (3a-1)th stage shift-register unit is coupled to a third clock signal as the reset signal, the clock terminal of the (3a)th stage shift-register unit is coupled to the third clock signal as the clock signal, and the reset terminal of the (3a)th stage shift-register unit is coupled to the first clock signal as the reset signal.

15. The driving device as claimed in claim 14, wherein the pulse producer further comprises a refresh terminal receiving a refresh signal for setting a start stage of the output signals.

16. The driving device as claimed in claim 15, wherein the buffer further comprises an inverter when the pulse producer only generates an output signal.

17. The driving device as claimed in claim 15, wherein the pulse producer generates a first output signal and a second output signal.

18. The driving device as claimed in claim 17, wherein each of the pulse producers comprises:
 a first transistor having a first source/drain coupled to a first voltage level;
 a second transistor having a first source/drain coupled to the first voltage level, a second source/drain coupled to a gate of the first transistor, and a gate receiving the setting signal;
 a third transistor having a first source/drain coupled to a second source/drain of the first transistor and a second source/drain coupled to the gate of the second transistor;

a fourth transistor having a first source/drain coupled to the gate of the first transistor and a second source/drain coupled to the trigger signal;

a fifth transistor having a first source/drain coupled to the first voltage level, a second source/drain coupled to the second source/drain of the first transistor for generating the first output signal, and a gate receiving the refresh signal; and a sixth transistor having a first source/drain coupled to the second source/drain of the second transistor and a second source/drain and a gate both coupled to the refresh signal.

19. The driving device as claimed in claim 18, wherein each of the buffers comprises:

a seventh transistor having a first source/drain coupled to the first voltage level, a second source/drain outputting the second pulse signal, and a gate receiving the second output signal;

an eighth transistor having a first source/drain coupled to the first voltage level, a second source/drain outputting the first pulse signal, and a gate coupled to the gate of the seventh transistor;

a ninth transistor having a first source/drain coupled to the second source/drain of the seventh transistor, a second source/drain coupled to the clock signal, and a gate coupled the first output signal; and a tenth transistor having a first source/drain coupled to the second source/drain of the eighth transistor, a source/drain coupled to the clock signal, and a gate coupled to the gate of the ninth transistor.

20. The driving device as claimed in claim 19, wherein the transistors are P-type and the first voltage level is a high voltage level.

21. The driving device as claimed in claim 19, wherein the transistors are N-type and the first voltage level is a ground level.

22. The driving device as claimed in claim 19, wherein the channel size of the eighth and tenth transistors is greater than the channel size of the seventh and ninth transistors.

* * * * *